United States Patent
Chang et al.

(10) Patent No.: US 9,487,393 B2
(45) Date of Patent: Nov. 8, 2016

(54) FABRICATION METHOD OF WAFER LEVEL PACKAGE HAVING A PRESSURE SENSOR

(71) Applicant: Siliconware Precision Industries Co., Ltd., Taichung (TW)

(72) Inventors: Hong-Da Chang, Taichung (TW); Hsin-Yi Liao, Taichung (TW); Chun-An Huang, Taichung (TW); Shih-Kuang Chiu, Taichung (TW); Chien-An Chen, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

(21) Appl. No.: 14/821,010

(22) Filed: Aug. 7, 2015

(65) Prior Publication Data

US 2015/0344299 A1 Dec. 3, 2015

Related U.S. Application Data

(62) Division of application No. 13/090,852, filed on Apr. 20, 2011, now Pat. No. 9,133,021.

(30) Foreign Application Priority Data

Jun. 30, 2010 (TW) ............................. 99121403 A

(51) Int. Cl.
*H01L 29/00* (2006.01)
*B81C 1/00* (2006.01)
*H01L 29/84* (2006.01)

(52) U.S. Cl.
CPC ....... *B81C 1/00301* (2013.01); *B81C 1/00269* (2013.01); *H01L 29/84* (2013.01); *B81B 2201/0264* (2013.01); *B81C 2203/0154* (2013.01); *H01L 2224/48091* (2013.01); *H01L 2924/10253* (2013.01); *H01L 2924/1461* (2013.01)

(58) Field of Classification Search
CPC ....................................................... H01L 23/48
See application file for complete search history.

(56) References Cited

U.S. PATENT DOCUMENTS

| | | |
|---|---|---|
| 5,659,195 A | 8/1997 | Kaiser et al. |
| 6,252,229 B1 | 6/2001 | Hays et al. |
| 6,828,674 B2 | 12/2004 | Karpman |
| 7,150,195 B2 | 12/2006 | Jacobsen et al. |
| 7,786,560 B2 | 8/2010 | Hong |
| 8,399,940 B2 | 3/2013 | Lin et al. |
| 2006/0185429 A1 | 8/2006 | Liu et al. |
| 2007/0275494 A1* | 11/2007 | Mayer .................. B81C 1/0023 438/50 |
| 2009/0085205 A1 | 4/2009 | Sugizaki |
| 2011/0018075 A1* | 1/2011 | Chen ...................... B81B 7/007 257/415 |
| 2011/0175179 A1* | 7/2011 | Chiu ...................... B81B 7/007 257/418 |

* cited by examiner

*Primary Examiner* — William Harriston
(74) *Attorney, Agent, or Firm* — Mintz Levin Cohn Ferris Glovsky and Popeo, P.C.; Peter F. Corless; Steven M. Jensen

(57) ABSTRACT

A wafer level package having a pressure sensor and a fabrication method thereof are provided. A wafer having the pressure sensor is bonded to a lid, and electrical connecting pads are formed on the wafer. After the lid is cut, wire-bonding and packaging processes are performed. Ends of bonding wires are exposed and serve as an electrical connecting path. A bottom opening is formed on a bottom surface of the wafer, in order to form a pressure sensor path.

8 Claims, 4 Drawing Sheets

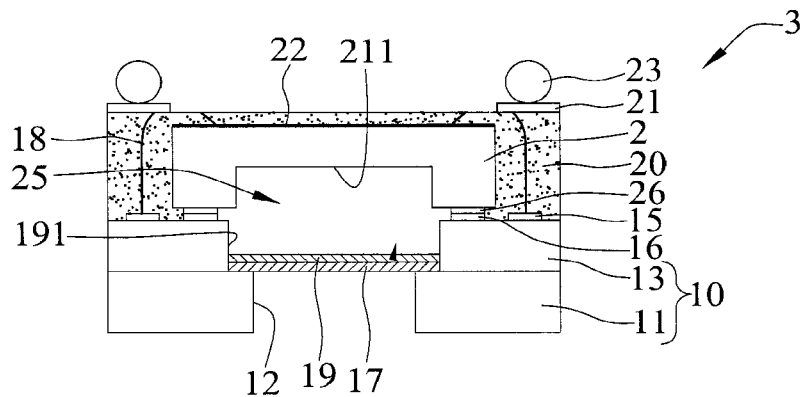
FIG. 1H
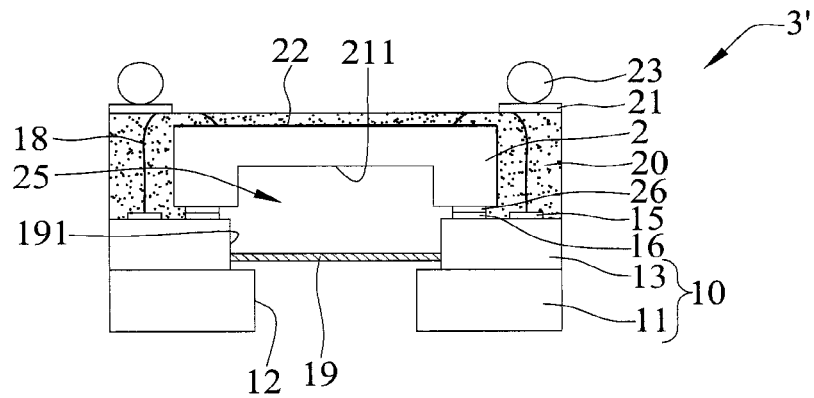
FIG. 1H'
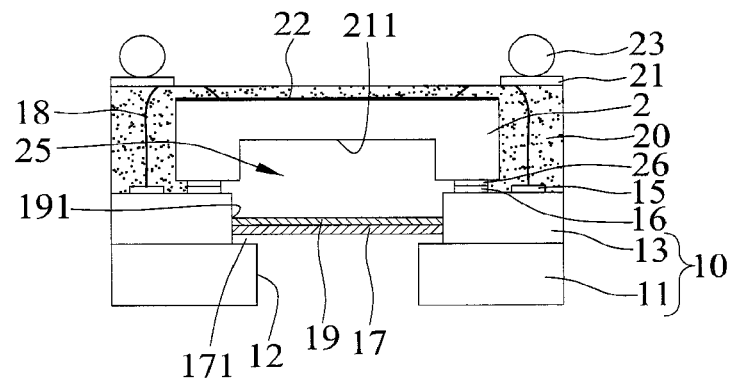
FIG. 1H"

FABRICATION METHOD OF WAFER LEVEL PACKAGE HAVING A PRESSURE SENSOR

CROSS-REFERENCE TO RELATED APPLICATIONS

This application is a divisional of application U.S. Ser. No. 13/090,852, filed on Apr. 20, 2011, which claims under 35 U.S.C. §119(a) the benefit of Taiwanese Application No. 099121403, filed Jun. 30, 2010, the entire contents of which are incorporated herein by reference.

BACKGROUND OF THE INVENTION

1. Field of the Invention

This invention relates to wafer level packages, and, more particularly, to a wafer level package having a pressure sensor and a fabrication method thereof.

2. Description of Related Art

A pressure sensor uses pressure sensing elements to sense gas or liquid pressure. With the rapid development of micro electromechanical systems (MEMS), a pressure sensor fabricated by micro electromechanical elements is popular in the art.

FIG. 2 shows a package having a pressure sensor according to the prior art, which generally employs an LGA package structure. The package comprises a substrate 30, micro electromechanical elements 31 disposed on the substrate 30, sensor film 32 installed on the micro electromechanical elements 31, a cavity chamber 35 formed between the sensor film 32 and micro electromechanical elements, bonding wires 33 electrically connected to the substrate 30 and the sensor film 32, a lid 34 installed on the substrate 30 that covers the micro electromechanical elements 31, and an opening 341 formed on the lid 34. Since the lid 34 has the opening 341, gas or liquid outside of the lid 34 may enter the lid 34. Further, the cavity chamber 35 also has a constant pressure. Therefore, when an external pressure presses the sensor film 32, a pressure difference may exist in the cavity chamber 35, which may be measured by the micro electromechanical element 31. The bonding wires 33 transmits signals to the substrate 30, and the substrate 30 is disposed on an applicable electronic element. A pressure sensing loop is thus formed. However, since a package in which the micro electromechanical element 31 are disposed on the substrate 30 has too great a size, and the electronic element cannot have a reduced volume.

Consequently, a wafer level micro electromechanical package structure process is brought to the art, which uses an etching process to operate a through-silicon via (TSV) process, and performs wafer bonding, so as to reduce the volume of a sensing element. As shown in FIG. 3, which illustrates a wafer level package having a pressure sensor disclosed in US Patent Application Publication No. 2006/0185429, the wafer level package comprises a silicon wafer 40, a sensor wafer 41 having a sensor film 411 that is stacked on the silicon wafer 40, and a glass wafer 42 that is disposed on the sensor wafer 41 by an anodic bonding process. The glass wafer 42 is formed with an opening 421 corresponding in position to the sensor film 411 together. The silicon wafer 40 and the sensor film 411 form a cavity chamber 45. The wafer level package has a sensing principle similar to that of the previously described package, such as further description thereto is hereby omitted. A silicon wafer drilling process is needed to form cavities and blind holes of cavity chamber 45 on the silicon wafer 40. The process is costly and demands sophisticated precision. Therefore, although a pressure sensing element may be fabricated by a wafer process, and a package having a small enough size may be thus obtained, the package is costly because the techniques for fabricating the same are complicated.

Therefore, how to provide a wafer level package structure fabricated by simple enough fabrication steps is becoming one of the popular issued in the art.

SUMMARY OF THE INVENTION

In view of the above-mentioned problems of the prior art, the present invention provides a fabrication method for a wafer level package. The fabrication method includes: preparing a wafer and a lid, the lid having a metal layer formed on a top surface thereof, the wafer having a pressure sensor, comprising a top cavity, electrical connecting pads formed on a circumference of the top cavity, and an etch stop layer and a sensor film formed in the top cavity that are connected to an inner rim of the top cavity, wherein the etch stop layer is positioned between a bottom of the top cavity and the sensor film; bonding the wafer and the lid to thereby form a cavity chamber thereinbetween; cutting the lid to expose the electrical connecting pads; electrically connecting the metal layer to the electrical connecting pads via a plurality of bonding wires; forming on the pressure sensor and the metal layer an encapsulant for encapsulating the bonding wires; removing a portion of the encapsulant from a top surface thereof, so as to expose the bonding wires; forming on the top surface of the encapsulant a redistribution layer that is electrically connected via the bonding wires to the electrical connecting pads; and forming from a bottom surface of the pressure sensor a bottom opening for exposing the etch stop layer.

In an embodiment of the present invention, the method further comprises implanting solder balls on the redistribution layer.

In an embodiment of the present invention, the method further comprises installing on the pressure sensor a first seal ring that surrounds the top cavity, and installing on a bottom surface of the lid a second seal ring that is correspondingly bonded to the first seal ring. In an embodiment of the present invention, the electrical connecting pads are formed on an external periphery of the first seal ring.

In an embodiment of the present invention, the method further comprises, before the solder balls are implanted, removing the etch stop layer.

The present invention further provides a wafer level package. The wafer level package includes: a pressure sensor having a top cavity exposed from a top surface thereof, and a bottom opening corresponding in position to the top cavity; a plurality of electrical connecting pads formed on a circumference of the top cavity; a sensor film installed between the top cavity and the bottom opening and connected to an inner rim of the top cavity; a lid having a bottom surface bonded to the pressure sensor, to form a cavity chamber thereinbetween; a plurality of bonding wires electrically connected to the electrical connecting pads; an encapsulant formed on the pressure sensor and the lid that encapsulates the bonding wires and exposes one end of each of the bonding wires; and a redistribution layer formed on a top surface of the encapsulant and electrically connected to another end of each of the bonding wires.

In an embodiment of the present invention, the wafer level package further comprises solder balls implanted on the redistribution layer.

In an embodiment of the present invention, the wafer level package further comprises an etch stop layer formed under the sensor film.

In an embodiment of the present invention, the wafer level package further comprises a metal layer formed on a top surface of the lid.

In a fabrication method according to the present invention, a wafer having a pressure sensor is bonded to a lid; electrical connecting pads are formed on the wafer; after the lid is cut, ends of bonding wires are exposed to serve as an electrical connecting path; and a bottom opening is formed on a bottom surface of the wafer so as to form a pressure inlet. Therefore, the present invention integrates wafer coupling and bonding processes, without the need of a through-silicon via (TSV) process that is complicated and costly. A novel wafer level package having a pressure sensor is thus obtained. The method is simple in step, and can fabricate a light, thin, and compact wafer level package.

BRIEF DESCRIPTION OF DRAWINGS

The invention can be more fully understood by reading the following detailed description of the preferred embodiments, with reference made to the accompanying drawings, wherein:

FIGS. 1A to 1H" illustrate a wafer level package having a pressure sensor and a fabrication method thereof according to the present invention, wherein FIG. 1A' illustrates that a space remains between an etch stop layer and a substrate, FIG. 1H' illustrates a wafer level package having a pressure sensor that has no etch stop layer, and FIG. 1H" illustrates a wafer level package obtained by the fabrication method of FIG. 1A';

DETAILED DESCRIPTION OF PREFERRED EMBODIMENTS

The following illustrative embodiments are provided to illustrate the disclosure of the present invention, these and other advantages and effects can be apparently understood by those in the art after reading the disclosure of this specification. The present invention can also be performed or applied by other different embodiments. The details of the specification may be on the basis of different points and applications, and numerous modifications and variations can be devised without departing from the spirit of the present invention.

Please refer to FIGS. 1A to 1H, which illustrate a wafer level package having a pressure sensor according to the present invention.

Figure 1A:
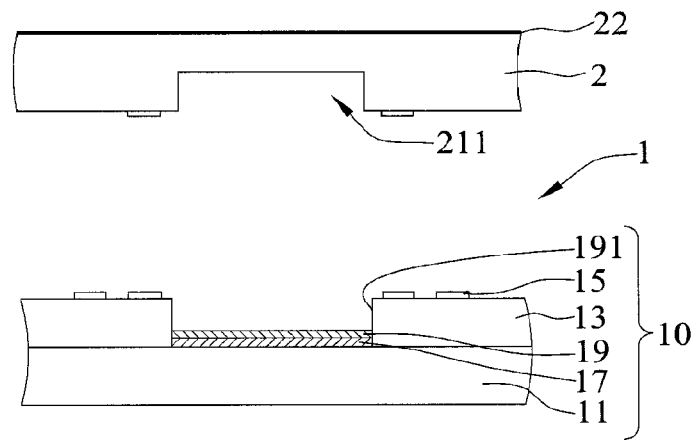
Figure 1A:
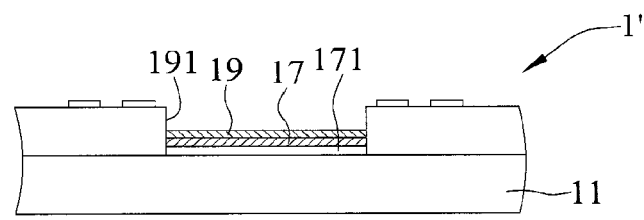

As shown in FIG. 1A, a wafer 1 and a lid 2 are prepared. The wafer 1 has a pressure sensor 10, and the pressure sensor 10 has a top cavity 191, electrical connecting pads 15 formed on a circumference of the top cavity 191, and an etch stop layer 17 and a sensor film 19 installed in the top cavity 191 and connected to an inner rim of the top cavity 191. The wafer 1 further comprises a substrate 11, and an intermetal dielectric (IMD) layer 13. In an embodiment of the present invention, the substrate 11 and the intermetal dielectric layer 13 are fabricated by a wafer contract manufacturer, the intermetal dielectric layer 13 is a circuit layer formed by a silicon material, the etch stop layer 17 is made of silicon dioxide, silicon nitride, or metal, and the sensor film 19 is made of silicon, poly-silicon, silicon dioxide, or metal that acts as a pressure sensor. The etch stop layer 17 is interposed between the substrate 11 and the sensor film 19. The top cavity 191 is formed on top surfaces of the intermetal dielectric layer 13 and the sensor film 19. The sensor film 19 is connected to a circuit layer in the intermetal dielectric layer 13. The sensor film 19 may be deformed and transmit electronic signals via the circuit layer in the intermetal dielectric layer 13 to the electrical connecting pads 15 on the intermetal dielectric layer 13. In the embodiment shown in FIG. 1A, a bottom cavity 211 is formed on a bottom surface of the lid 2, and a metal layer 22 is formed on a top surface of the lid 2. The bottom cavity 211 can be formed by etching the bottom surface of the lid 2 by a dry or wet etching process. The bottom cavity 211 corresponds in size to the top cavity 191.

In another embodiment shown in FIG. 1A', the etch stop layer 17 is not installed on the substrate 11, as shown in FIG. 1A, and a gap or a space 171 is formed between the etch stop layer 17 and the substrate 11. The etch stop layer 17 and the sensor film 19 are still bonded to the inner rim of the intermetal dielectric layer 13, so as to form the top cavity 191 on the top surface of the sensor film 19.

Figure 1B:
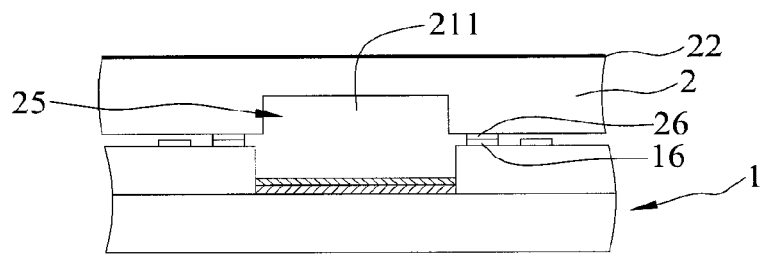

As shown in FIG. 1B, the intermetal dielectric layer 13 of the pressure sensor 10 is bonded to the lid 2 by a bonding process, for example, such that the top cavity 191 corresponds in position to the bottom cavity 211 and forms a sealed cavity chamber 25 between the pressure sensor 10 and the lid 2. In an embodiment shown in FIG. 1B, a first seal ring 16 is installed on the intermetal dielectric layer 13 of the pressure sensor 10 that surrounds the top cavity 191, and a second seal ring 26 is formed on the bottom surface of the lid 2 that surrounds the bottom cavity 211 and are correspondingly bonded to the first seal ring 16. In an embodiment of the present invention, the first seal ring 16 and the second seal ring 26 may be made of metal such as tin or other material such as glass frit. The electrical connecting pads 15 are formed on an external periphery of the first seal ring 16.

Figure 1C:
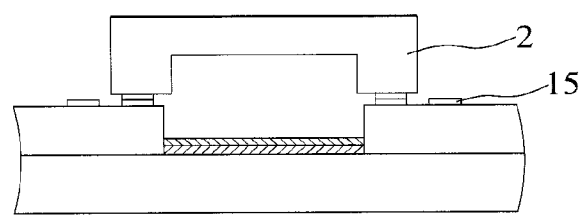

As shown in FIG. 1c, the lid 2 is cut to expose the electrical connecting pads 15.

Figure 1D:
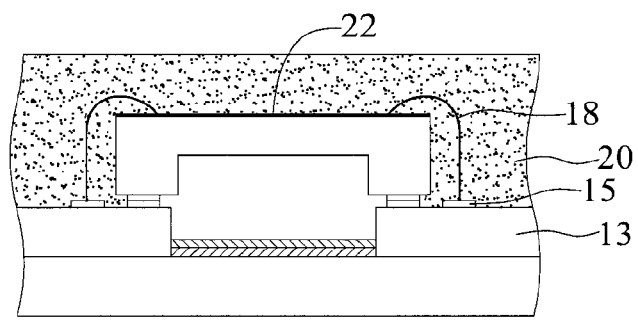

As shown in FIG. 1D, bonding wires 18 are used to electrically connect the metal layer 22 to the electrical connecting pads 15. Since the electrical connecting pads 15 are formed on the intermetal dielectric layer 13, the electrical connecting pads 15 are electrically connected to the intermetal dielectric layer 13. In an embodiment of the present invention, the electrical connecting pads 15 may be bonded to the metal layer 22 by a bonding process. Then, an encapsulant 20 is formed on the intermetal dielectric layer 13 and the metal layer 22 to encapsulate the bonding wires 18.

Figure 1E:
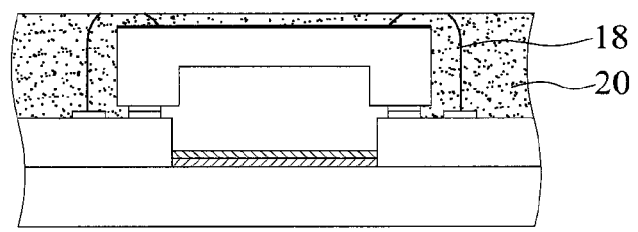

As shown in FIG. 1E, a portion of a top surface of the encapsulant 20 is removed by a chemical mechanical polishing process, to expose the bonding wires 18.

Figure 1F:
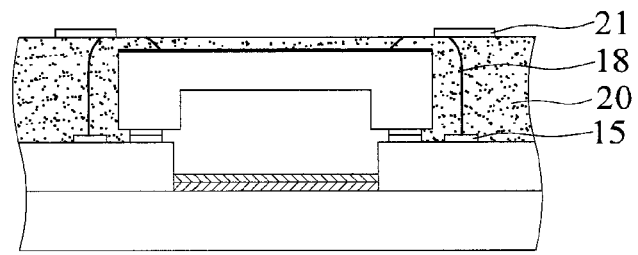

As shown in FIG. 1F, a redistribution layer 21 is formed on the top surface of the encapsulant 20 where a portion of the encapsulant 20 is removed, and is electrically connected via the bonding wires 18 to the electrical connecting pads 15.

Figure 1G:
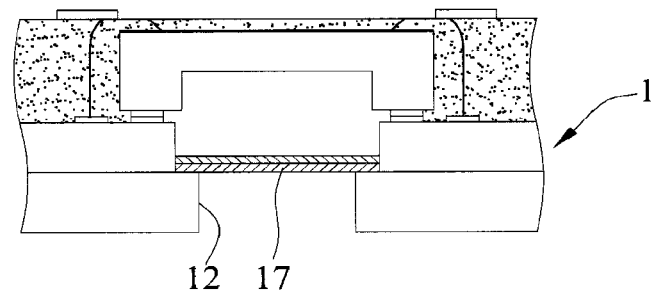
Figure 2:
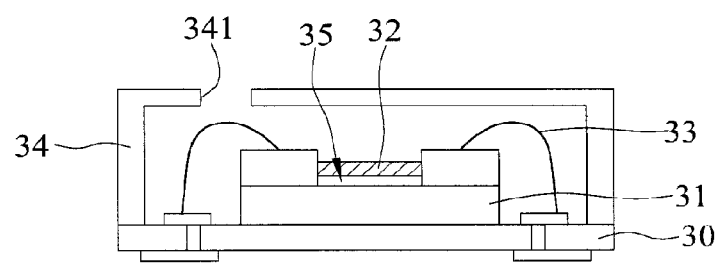
FIG. 2 is a cross sectional view of a package having a pressure sensor according to the prior art.
Figure 3:
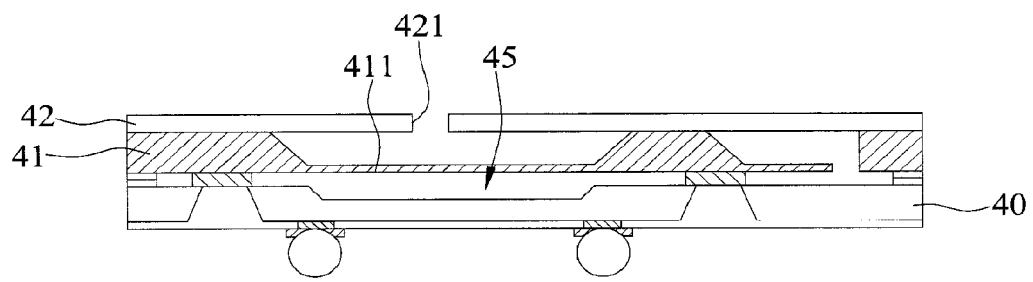
FIG. 3 is a cross sectional view of a wafer level package having a pressure sensor package according to the prior art.

As shown in FIG. 1G, a portion of the substrate 11 is removed from a bottom surface of the wafer 1 by a dry etching process such as a deep reactive ion etching process (DRIE), or a wet etching process using KOH, so as to form a bottom opening 12 that penetrates the substrate 11. Since the etch stop layer 17 may stop the etching process, after the step is complete, the etch stop layer 17 is exposed. In an embodiment of the present invention, the etch stop layer 17 may be removed, depending on users' demands.

As shown in FIG. 1H, solder balls 23 are implanted on the redistribution layer 21, and the encapsulant 20 is cut, to obtain a single wafer level package 3 having a pressure sensor according to the present invention.

According to the previously described fabrication method, the present invention further provides a wafer level package 3, which includes a pressure sensor 10 having a top cavity 191 that is exposed from a top surface thereof and a bottom opening 12 that corresponds in position to the top cavity 191; a plurality of electrical connecting pads 15 formed on a circumference of the top cavity 191; and a sensor film 19 installed between the top cavity 191 and the bottom opening 12 and connected to an inner rim of the top cavity 191. The pressure sensor 10 comprises the substrate 11 and the intermetal dielectric layer 13, wherein the intermetal dielectric layer 13 is formed on the substrate 11, and the electrical connecting pads 15 are formed on the intermetal dielectric layer 13.

The wafer level package 3 further comprises the lid 2 having a bottom cavity 211 formed on a bottom surface thereof. The bottom surface of the lid 2 is bonded to the intermetal dielectric layer 13 of the pressure sensor 10, such that the bottom cavity may correspond in position to the top cavity 191, to form a cavity chamber 25 with the top cavity 191. A plurality of bonding wires 18 are electrically connected to the electrical connecting pads 15. An encapsulant 20 is formed on the pressure sensor 10 and the lid 2, to encapsulate the bonding wires 18 and expose ends of the bonding wires 18. A redistribution layer 21 is formed on a top surface of the encapsulant 20 and is electrically connected to the bonding wires 18. Additionally, solder balls 23 may be implanted on the redistribution layer 21.

In an embodiment, the wafer level package 3 further comprises a metal layer 22 formed on the top surface of the lid 2.

In an embodiment of the present invention, the wafer level package 3 further comprises an etch stop layer 17 formed under the sensor film 19 and between the bottom opening 12 and the sensor film 19. In an embodiment of the present invention, the etch stop layer 17 is formed on the substrate 11.

As in an embodiment shown in FIG. 1H, the first seal ring 16 is installed on the intermetal dielectric layer 13 of the pressure sensor 10 that surrounds the top cavity 191, and the second seal ring 26 is installed on the bottom surface of the lid 2 that surrounds the bottom cavity 211 and are correspondingly bonded to the first seal ring 16. In an embodiment of the present invention, the first seal ring 16 and the second seal ring 26 may be made of metal such as tin or other materials such as glass frit. The electrical connecting pads 15 are formed on the external periphery of the first seal ring, and are electrically connected to the intermetal dielectric layer 13. The wafer level package 3 further comprises a metal layer 22 formed on the top surface of the lid 2.

The etch stop layer 17 may be removed during the fabrication of the wafer level package. Accordingly, a wafer level package 3' having a pressure sensor that does not have the etch stop layer 17 is obtained, as shown in FIG. 1H'.

In another embodiment shown in FIG. 1H", if the wafer 1' shown in FIG. 1A' is selected, a space 171 is formed between the etch stop layer 17 and the substrate 11, but the etch stop layer 17 and the sensor film 19 are still bonded to the intermetal dielectric layer 13, so as to form a top cavity 191 on the top surface of the sensor film 19.

In a fabrication method according to the present invention, a wafer having a pressure sensor is bonded to a lid; electrical connecting pads are formed on the wafer; after the lid is cut, ends of bonding wires are exposed, to serve as an electrical connecting path; and a bottom opening is formed on a bottom surface of the wafer to form a pressure inlet. Therefore, the present invention integrates wafer coupling and bonding processes, without the need of a through-silicon via (TSV) process that is complicated and costly. A novel wafer level package having a pressure sensor is thus obtained. The method has simple steps, and may fabricate a light, thin, and compact wafer level package.

The foregoing descriptions of the detailed embodiments are only illustrated to disclose the features and functions of the present invention and not restrictive of the scope of the present invention. It should be understood to those in the art that all modifications and variations according to the spirit and principle in the disclosure of the present invention should fall within the scope of the appended claims.

What is claimed is:

1. A fabrication method for a wafer level package, the fabrication method comprising:
preparing a wafer and a lid having a metal layer formed on a top surface thereof, the wafer having a pressure sensor which comprises a top cavity, electrical connecting pads formed on a circumference of the top cavity, and an etch stop layer and a sensor film formed in the top cavity that are connected to an inner rim of the top cavity, wherein the etch stop layer is positioned between a bottom of the top cavity and the sensor film;
bonding the wafer and the lid to thereby form a cavity chamber thereinbetween;
cutting the lid to expose the electrical connecting pads;
electrically connecting the metal layer to the electrical connecting pads via a plurality of bonding wires;
forming on the pressure sensor and the metal layer an encapsulant for encapsulating the bonding wires;
removing a portion of the encapsulant from a top surface thereof, so as to expose the bonding wires;
forming on the top surface of the encapsulant a redistribution layer that is electrically connected via the bonding wires to the electrical connecting pads; and
forming from a bottom surface of the pressure sensor a bottom opening for exposing the etch stop layer.

2. The fabrication method of claim 1, further comprising installing on the pressure sensor a first seal ring that surrounds the top cavity, and installing on a bottom surface of the lid a second seal ring that is correspondingly bonded to the first seal ring.

3. The fabrication method of claim 2, wherein the electrical connecting pads are formed on an external periphery of the first seal ring.

4. The fabrication method of claim 1, further comprising implanting solder balls on the redistribution layer.

5. The fabrication method of claim 4, further comprising, before the solder balls are implanted, removing the etch stop layer.

6. The fabrication method of claim 1, wherein the etch stop layer is made of silicon dioxide, silicon nitride, or metal.

7. The fabrication method of claim 1, wherein the sensor film is made of silicon, poly-silicon, silicon dioxide, or metal.

8. The fabrication method of claim 1, further comprising forming on a bottom surface of the lid a bottom cavity that corresponds in position to the top cavity, so as to form the cavity chamber together with the top cavity.

* * * * *